United States Patent
Zhou et al.

(10) Patent No.: US 11,919,149 B2
(45) Date of Patent: Mar. 5, 2024

(54) AUTONOMOUS GROUND VEHICLE FOR SOLAR MODULE INSTALLATION

(71) Applicant: Rosendin Electric, Inc., San Jose, CA (US)

(72) Inventors: Charles Zhou, Alameda, CA (US); William Paul Mazzetti, Jr., San Francisco, CA (US); Halston Ryan Rowe, Escondido, CA (US); David Scott Lincoln, San Clemente, CA (US)

(73) Assignee: Rosendin Electric, Inc., San Jose, CA (US)

( * ) Notice: Subject to any disclaimer, the term of this patent is extended or adjusted under 35 U.S.C. 154(b) by 252 days.

(21) Appl. No.: 17/206,477

(22) Filed: Mar. 19, 2021

(65) Prior Publication Data

US 2021/0205997 A1 Jul. 8, 2021
US 2023/0321842 A9 Oct. 12, 2023

Related U.S. Application Data

(60) Provisional application No. 63/044,939, filed on Jun. 26, 2020, provisional application No. 62/992,468, filed on Mar. 20, 2020.

(51) Int. Cl.
*B25J 9/16* (2006.01)
*B25J 5/00* (2006.01)
(Continued)

(52) U.S. Cl.
CPC ........... *B25J 15/0616* (2013.01); *B25J 5/005* (2013.01); *B25J 9/162* (2013.01); *B25J 9/1664* (2013.01);
(Continued)

(58) Field of Classification Search
CPC ...... B25J 5/00–04; B25J 9/162; B25J 9/1664; B25J 9/1697; G05D 1/0231–0253; G05D 2201/0202; G05D 2201/0216
See application file for complete search history.

(56) References Cited

U.S. PATENT DOCUMENTS 8,365,386 B2 2/2013 Vontz et al.
8,635,773 B2 1/2014 Carter et al.
(Continued)

FOREIGN PATENT DOCUMENTS

AU 2015101469 A4 11/2015
AU 2018369820 A1 5/2020
(Continued)

OTHER PUBLICATIONS

SilentPC, "Waterproof PC," accessed Mar. 8, 2020, https://silentpc.com/fanless-pcs/waterproof-pc (Year: 2020).*
(Continued)

*Primary Examiner* — Spencer D Patton
(74) *Attorney, Agent, or Firm* — Rutan and Tucker, LLP

(57) ABSTRACT

An autonomous solar module installation platform can be used for solar module installation onto a solar tracker. The autonomous solar module installation platform can include an autonomous ground vehicle and a robotic arm for the solar module installation onto the solar tracker. The autonomous ground vehicle can autonomously drive itself to the solar tracker using a global positioning system and align itself with the solar tracker using at least a vision system in order to place one or more solar modules onto the solar tracker.

21 Claims, 4 Drawing Sheets

(51) Int. Cl.
  *B25J 13/08*  (2006.01)
  *B25J 15/06*  (2006.01)
  *G05D 1/00*  (2006.01)
  *H02S 20/32*  (2014.01)

(52) U.S. Cl.
  CPC .......... *B25J 9/1679* (2013.01); *B25J 9/1697* (2013.01); *B25J 13/087* (2013.01); *G05D 1/0088* (2013.01); *G05D 1/0231* (2013.01); *H02S 20/32* (2014.12); *G05D 2201/0216* (2013.01)

(56) References Cited

U.S. PATENT DOCUMENTS

| | | | |
|---|---|---|---|
| 8,657,991 | B2 | 2/2014 | Potter et al. |
| 8,688,275 | B1 | 4/2014 | LaFary et al. |
| 9,403,566 | B2 | 8/2016 | Jacobsen |
| 9,494,341 | B2 | 11/2016 | Trujillo et al. |
| 9,655,292 | B2 | 5/2017 | Swahn et al. |
| 9,882,067 | B2 | 1/2018 | Britcher et al. |
| 9,919,753 | B2 | 3/2018 | Jacobsen |
| 9,937,846 | B2 | 4/2018 | French et al. |
| 10,232,505 | B2 | 3/2019 | Tadayon et al. |
| 10,277,163 | B1 | 4/2019 | Meller et al. |
| 10,439,550 | B1 | 10/2019 | Goodman et al. |
| 10,696,451 | B2 | 6/2020 | Britcher et al. |
| 10,926,401 | B2 | 2/2021 | Tadayon et al. |
| 11,241,799 | B2 | 2/2022 | Clemenzi et al. |
| 11,245,353 | B2 | 2/2022 | Stefano et al. |
| 11,398,040 | B2 | 7/2022 | Asmari |
| 2012/0027550 | A1 | 2/2012 | Bellacicco et al. |
| 2012/0152877 | A1 | 6/2012 | Tadayon et al. |
| 2012/0199266 | A1 | 8/2012 | Potter et al. |
| 2012/0310444 | A1 | 12/2012 | Fitch et al. |
| 2013/0019925 | A1* | 1/2013 | Britcher .................. H02S 20/30 136/251 |
| 2013/0133172 | A1 | 5/2013 | Kiener et al. |
| 2013/0146123 | A1 | 6/2013 | Park |
| 2015/0331972 | A1 | 11/2015 | McClure et al. |
| 2016/0129592 | A1 | 5/2016 | Saboo et al. |
| 2016/0368135 | A1* | 12/2016 | Tadayon .................. B25J 5/00 |
| 2017/0089502 | A1* | 3/2017 | Genta ...................... B66F 7/065 |
| 2017/0229029 | A1 | 8/2017 | Klinger et al. |
| 2019/0267936 | A1 | 8/2019 | Jensen et al. |
| 2020/0036325 | A1 | 1/2020 | Poivet |
| 2020/0304062 | A1 | 9/2020 | Shugar |
| 2020/0412295 | A1 | 12/2020 | Miller et al. |
| 2021/0069889 | A1 | 3/2021 | Jacobsen |
| 2021/0086589 | A1* | 3/2021 | Shao ...................... G05D 1/021 |
| 2021/0149409 | A1* | 5/2021 | Honsel ............... G01C 21/3644 |
| 2021/0211096 | A1 | 7/2021 | Clemenzi |
| 2021/0218363 | A1 | 7/2021 | Ferreira et al. |
| 2021/0379757 | A1 | 12/2021 | Schneider et al. |
| 2022/0069770 | A1 | 3/2022 | Shelton et al. |
| 2022/0103122 | A1 | 3/2022 | Carter et al. |
| 2022/0006421 | A1 | 6/2022 | Annibale et al. |
| 2022/0212345 | A1 | 7/2022 | Smith |

FOREIGN PATENT DOCUMENTS

| | | |
|---|---|---|
| EP | 2263964 A2 | 12/2010 |
| EP | 2267377 B1 | 1/2015 |
| EP | 3569349 B1 | 3/2021 |
| EP | 3591838 B1 | 4/2021 |
| EP | 3711157 A1 | 9/2022 |
| JP | 2016082633 A | 2/2018 |
| WO | 2010145844 A2 | 12/2010 |
| WO | 2019097348 A1 | 5/2019 |
| WO | 2021229110 A1 | 11/2021 |
| WO | 2021229387 A2 | 11/2021 |
| WO | 2022008958 A1 | 1/2022 |
| WO | 2022112921 A1 | 6/2022 |
| WO | 2022187264 A1 | 9/2022 |

OTHER PUBLICATIONS

International Searching Authority, International Search Report PCT/US2021/023112, dated Jul. 8, 2021, 2 pages.

International Searching Authority, International Search Report PCT/US2021/023113, dated Jun. 24, 2021, 10 pages.

* cited by examiner

AUTONOMOUS GROUND VEHICLE FOR SOLAR MODULE INSTALLATION

CROSS-REFERENCE

This application claims priority under 35 USC 119 to U.S. provisional patent application Ser. No. 62/992,468, Filed: Mar. 20, 2020, titled: An autonomous ground vehicle for solar panel installation, as well as U.S. Provisional Patent Application No. 63/044,939, Filed: Jun. 26, 2020, titled: Autonomous ground vehicle for solar panel installation, both of which the disclosure of such is incorporated herein by reference in their entirety.

TECHNICAL FIELD

Embodiments of this disclosure relate generally to solar power.

BACKGROUND

Today, installing and removing solar modules in a solar farm experience many problems including a need to pause work at night, crews need to be trained because no uniform solar tracker and solar module exists as well as the workers in the crew can change; and thus, training may need occur for each solar farm installation, a repetitive task performed over and over again can lead to human complacence and errors over time, and weather and bad conditions interfere with the work.

SUMMARY

Provided herein are various methods, apparatuses, and systems for an intelligent robotic system and task orientated processes. In an embodiment, an autonomous solar module installation platform can be used for solar module installation onto a solar tracker. The autonomous solar module installation platform can include an autonomous ground vehicle and a robotic arm for the solar module installation onto the solar tracker. The autonomous ground vehicle can autonomously drive itself to the solar tracker using a global positioning system and align itself with the solar tracker using at least a vision system during the solar module installation onto the solar tracker.

These and many more embodiments are discussed.

DRAWINGS

Figure 1:
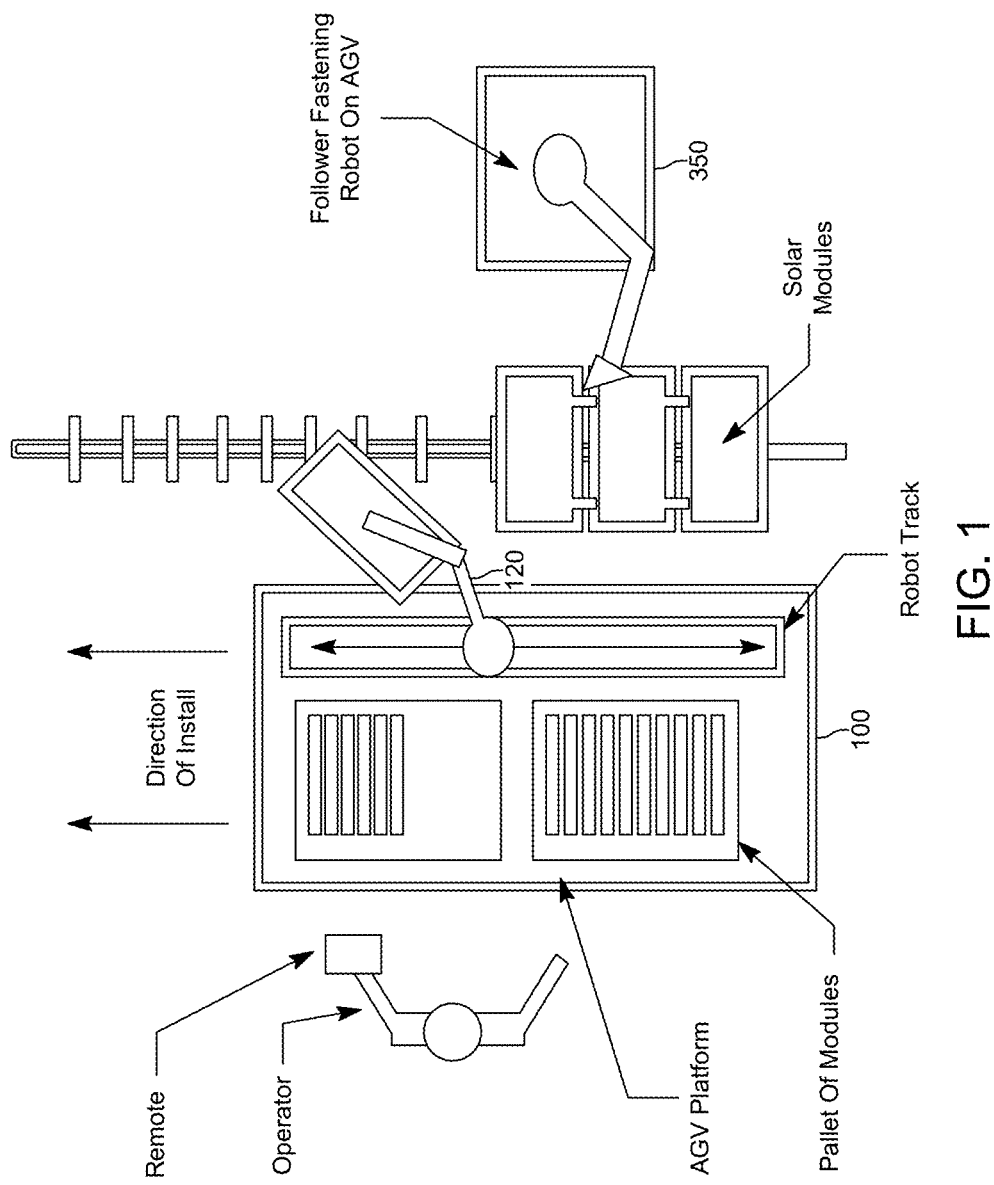
FIG. 1 illustrates a block diagram of an embodiment of an example autonomous ground vehicle that can autonomously install one or more solar module installations onto a solar tracker.

While the design is subject to various modifications, equivalents, and alternative forms, specific embodiments thereof have been shown by way of example in the drawings and will now be described in detail. It should be understood that the design is not limited to the particular embodiments disclosed, but—on the contrary—the intention is to cover all modifications, equivalents, and alternative forms using the specific embodiments.

DESCRIPTION

In the following description, numerous specific details can be set forth, such as examples of specific data signals, named components, number of frames, etc., in order to provide a thorough understanding of the present design. It will be apparent, however, to one of ordinary skill in the art that the present design can be practiced without these specific details. In other instances, well known components or methods have not been described in detail but rather in a block diagram in order to avoid unnecessarily obscuring the present design. Further, specific numeric references such as the first server, can be made. However, the specific numeric reference should not be interpreted as a literal sequential order but rather interpreted that the first server is different than a second server. Thus, the specific details set forth can be merely exemplary. The specific details can be varied from and still be contemplated to be within the spirit and scope of the present design. The term "coupled" is defined as meaning connected either directly to the component or indirectly to the component through another component.

FIG. 1 illustrates a block diagram of an embodiment of an example autonomous ground vehicle that can autonomously install one or more solar module installations onto a solar tracker. The 'autonomous solar module installation platform for solar module installation onto a solar tracker' can be used for solar module installation in, for example, utility grade solar farms. The autonomous solar module installation platform for solar module installation onto a solar tracker can consist of multiple components. Some example components in the system can include:

1. An off-road, autonomous ground vehicle 100 with a robotic arm 120 for solar module placement;
2. A robotic cell having a robotic arm 120 and optionally a track for solar module placement;
3. One or more software coded methods used to install solar modules;
4. A set of cooperating solar module carrier-robots 200, 209 to carry one or more pallets of solar modules; and
5. Optionally, a cooperating fastening robot 350 to fasten one or more solar modules onto a solar tracker.

The autonomous solar module installation platform can be configured to be autonomous for the entirety of moving along a row of trackers using at least a global positioning system (GPS) to each individual solar tracker and lifting the solar modules/panels, at least, into installation position using a vision system onto the corresponding mating mounts on the solar tracker. The off-road capable autonomous ground vehicle platform 100 serves as a base. The autonomous ground vehicle platform 100 has code and sensors to be autonomous for the entire process of moving along a row of solar trackers and installing solar modules/panels onto each solar tracker achieving autonomous operation on its own. The autonomous ground vehicle 100 can perform every step of the installation process of the solar modules/panels onto the tracker, itself achieving more autonomous operation. Alternatively, the autonomous ground vehicle 100 can hold and hover the solar module above the position where the solar module needs to integrate onto the tracker, and allow a human to guide the solar module into the mounting components on the solar tracker for a final step the installation process. A robotic arm 120 can support the weight of the solar module during the installation with the human guiding the solar module onto the solar tracker in its mounting components. The autonomous ground vehicle 100 will work in tandem with the human installer to pick up and install solar modules onto the solar tracker and then have the human operator fasten and secure the solar modules in place. The human can cooperate with the autonomous ground vehicle 100 to secure and fasten the solar panel when properly positioned onto the tracker in place. The autonomous ground vehicle 100 also can have the additional capability to incorporate human operated remote control operations into its own operations of driving and robotic arm 120 operation. In some situations, it might be easier for a human to assist in the driving and robotic arm 120 operation.

The autonomous ground vehicle 100 will generally drive the autonomous ground vehicle 100 itself to each solar tracker and align itself with that solar tracker automatically in order to place the solar modules onto that solar tracker. The autonomous ground vehicle 100 can self-drive itself using a vision system such as a camera based-computer vision system and/or Lidar, sensors, and optionally a remote for assisting in various aspects such as driving. The autonomous ground vehicle 100 has a self-driving system using self-driving software and sensors, such as a vision system (camera based vision system, Lidar vision system, etc.) and other sensors, and a remote for assisting in various aspects, such as driving and robotic arm picking up and placing operations.

By the very nature of solar farms, each row of solar trackers is located on a relatively known location on a map of the solar farm. Each solar farm has one or more devices that give off precise GPS coordinates. Normally, at least one GPS device is located in a control room of a solar farm. Each solar tracker is usually installed in a pre-planned location on that farm per its planning drawings; and thus, the autonomous ground vehicle 100 can drive directly to the beginning of each row by using the approximate GPS coordinates of that row of trackers and/or the autonomous ground vehicle 100 can calculate a distance to a row of solar trackers from a known GPS coordinates and then drive a specific distance and direction from a device on the solar farm that can broadcast or otherwise convey its GPS coordinates in order to eventually arrive at a target solar tracker. In either circumstance, the autonomous ground vehicle 100 will roughly align itself with each row of solar trackers and then proceed down the row to align itself with each individual solar tracker when installing solar modules onto those trackers via GPS based decisions. The GPS based decisions can be the GPS coordinates directly on the solar tracker and/or calculations of distance and direction from known GPS coordinates. Note, the autonomous ground vehicle 100 has its own GPS device that it can reference and a memory, processing unit, and software to reference a plot/map of that solar farm. Next, the ground vehicle is coded to use its computer vision and/or Lidar system for fine adjustments to account for any imperfection on how planar/straight the real row of solar trackers is and/or an exact location in the solar farm of each individual solar trackers is and the ground vehicle's positioning relative to the solar tracker for the solar module installation and/or removal. The autonomous ground vehicle 100 can also have a manual steering wheel, accelerometer, and braking system in order for a human to assist in moving the vehicle. Thus, the autonomous ground vehicle 100 system uses computer vision and GPS coordinates to be able to self-drive around a solar farm, including up and down rows of solar trackers, as well as to autonomously move to individual solar trackers during a solar module installation and/or replacement session.

Next, the autonomous ground vehicle 100 with its robotic arm 120 can self-level at least the robotic arm 120 relative to the solar tracker, accounting for a terrain, using 1) a leveling mechanism consisting of any of i) screw actuators, ii) hydraulic cylinders, iii) airbags, iv) pneumatic actuators, and v) any combination of these, at multiple corners of a deck of the autonomous ground vehicle 100 to level the robotic arm 120 on the deck relative to the solar tracker and 2) a level sensor. The leveling mechanism cooperates with the level sensor in order to level relative to the solar tracker. In an embodiment, each corner of the deck of the autonomous ground vehicle 100 can have self-level actuators such as screw mechanisms, airbags, and/or hydraulic actuators, to level the robotic arm 120 with respect to an individual solar tracker. The self-leveling actuators cooperate with a tilt sensor and/or incline sensor/meter in order to level the robotic arm 120 so calculations for arm positioning algorithms to install and/or uninstall a solar module on that type of solar tracker are correct, relative to the particular solar tracker next to it. The self-level actuators will self-level the deck and robotic arm 120 on the deck relative to the tracker and the terrain so that the autonomous ground vehicle 100 can adapt to any job site conditions; and thus, any deviations particular to the current solar tracker undergoing a solar module installation compared to another solar tracker in a given solar farm.

Next, both the robotic cell containing the robotic arm 120 and the autonomous ground vehicle 100 are designed and constructed to be used off-road and outdoors for installation work on a job site.

The autonomous solar module installation platform for solar module installation onto a solar tracker is built for off-road (e.g. muddy terrain, sandy terrain, etc.) operation. The off-road autonomous solar module installation platform serves as a mobile base to autonomously move to individual solar trackers in a solar module installation.

Again, the autonomous ground vehicle 100 is coded to autonomously drive itself to the solar tracker and align itself with the solar tracker in order to place one or more solar modules onto the solar tracker. The autonomous ground vehicle 100 has an ability to autonomously drive itself via use of a computer vision system and/or a Lidar system cooperating with a GPS sensor and driving software resident in a drive module for the autonomous ground vehicle 100 to drive itself to the solar tracker and align itself with the solar tracker. The driving software is coded to any of 1) drive a route to GPS coordinates of the solar tracker when the solar tracker has a GPS device on that solar tracker and/or when GPS coordinates (e.g. GPS service) is available at a particular solar tracker location and 2) calculate one or more specific distances, directions, and routes from known GPS coordinates on a solar farm to the solar tracker and then drive those distances, directions, and routes to the solar tracker (when GPS service is not possible at the particular solar tracker's location).

In an embodiment, the autonomous ground vehicle 100 is able to navigate outdoors in off-road construction environments using any of i) a combination of computer vision and LIDAR system, ii) locally remote controlled, iii) by teleoperation (remote operator), and/or iv) by a pre-planned (recorded) route with calculable distances and directions from a known GPS coordinates. The autonomous ground vehicle 100 can install panels on multiple different types of trackers, work on flat terrain, work on unleveled terrain, and many other functions. The autonomous ground vehicle 100 can have one or more of i) off-road deep-tread tires (e.g. off-road agricultural type tires/tractor tires), ii) a tracked belt drive system, and iii) a powerful enough engine to be able to maneuver in tough terrain. The autonomous ground vehicle 100 engine has enough horsepower to drive the several thousand pounds of the ground vehicle with a fully loaded payload capacity of solar modules (potentially on a side vehicle) such as 8,000 lbs or greater. Next, the autonomous ground vehicle 100 may be battery-operated and/or have a gas-powered engine. The track drive system and/or off terrain deep tread mud tires can be powered through a direct drive system via the electric motor. Each track can be operated independently, so that the autonomous ground vehicle 100 can turn in place easily. Each track being able to move independently of the other track also allows the vehicle to get unstuck easier and be more reliable in off road conditions. The autonomous ground vehicle 100 system is able to move in rough terrain, sandy conditions, and muddy conditions with the heavy weight of the vehicle and its fully loaded stack of solar modules. When the autonomous ground vehicle 100 is designed to cooperate with the solar module carrier-robots, then each different movable vehicle can have a smaller/less powerful engine.

This autonomous solar module installation platform is a truly agnostic installation robot that installs panels on any solar tracker (tracker manufacturer and type agnostic) and on any grade or terrain (terrain agnostic).

Figure 2:
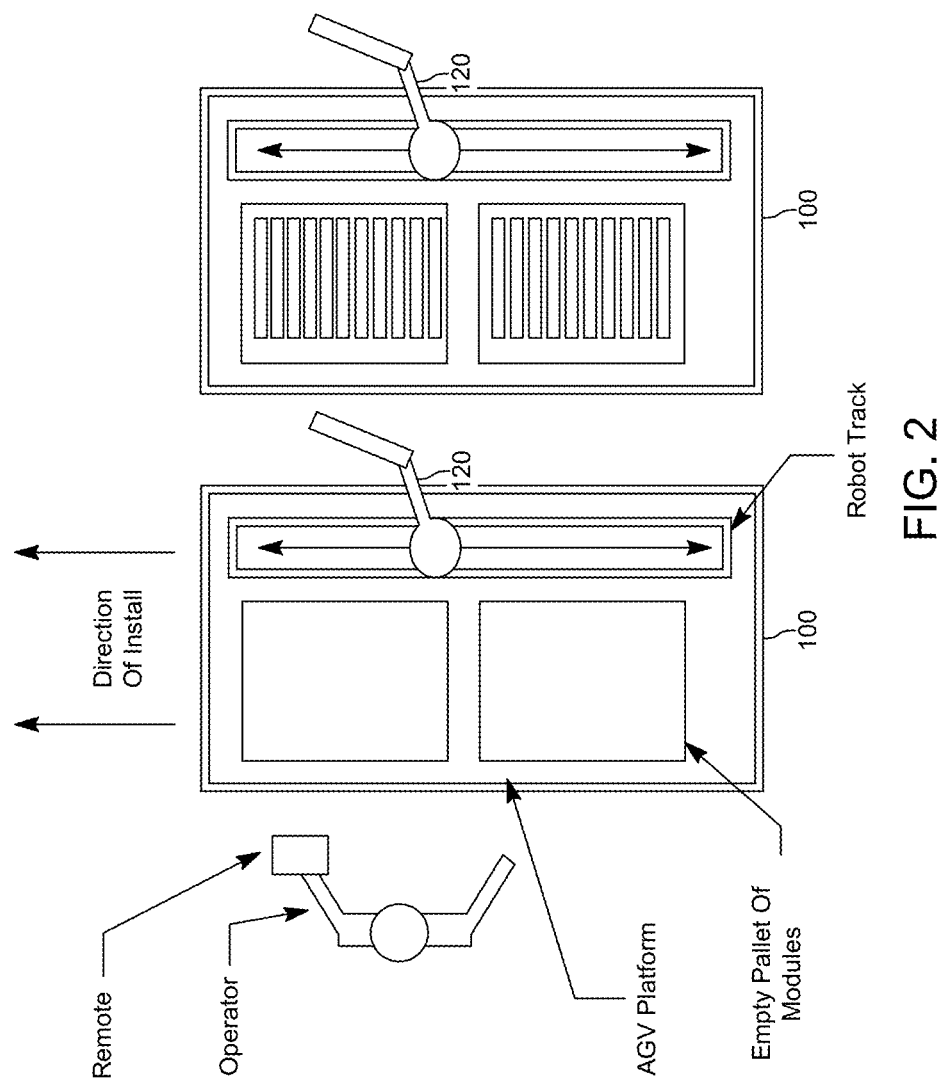
FIG. 2 illustrates a block diagram of an embodiment of an example additional vehicles such as 1) another autonomous ground vehicle with deck space to carry solar modules, a solar module carrier-robot carrying solar modules, or 3) other similar vehicle, cooperating with the autonomous ground vehicle for solar module installation.

FIG. 2 illustrates a block diagram of an embodiment of an example additional vehicles such as 1) another autonomous ground vehicle with deck space to carry solar modules, a solar module carrier-robot carrying solar modules, or 3) other similar vehicle, cooperating with the autonomous ground vehicle for solar module installation.

Most importantly, a fleet of two or more vehicles, including the autonomous ground vehicle 100, can each have a wireless communication system to exchange communications with the autonomous ground vehicle 100, currently installing solar modules, to perform the solar module installation. A control room in the solar farm, through its own communications module can wirelessly coordinate activities of bringing additional solar modules over to the autonomous ground vehicle 100 currently installing solar modules, when an amount of solar modules remaining is at or below a threshold amount, so that the robotic arm and the autonomous ground vehicle 100 can perform the solar module installation on a continuous basis. The autonomous ground vehicle 100 can be configured to wireless communicate and otherwise cooperate with one or more additional vehicles directly and/or through the control room. The additional vehicles can be another autonomous ground vehicle 100 when this vehicle is constructed to both carry the solar modules and have the robotic arm. (See e.g. FIG. 2) However, the additional vehicles can also be two separate types of vehicles that split the functionality into—one type for merely carrying solar modules and a second type of vehicle with merely a robotic arm for picking up and placing the solar modules onto the solar tracker.

The autonomous ground vehicle 100 has a coupling mechanism that mechanically and electrically connects a solar module carrier-robot 200 and the autonomous ground vehicle 100 for solar module installation. The coupling mechanism also has an electronic release to decouple the solar module carrier-robot 200 and the autonomous ground vehicle 100. In an embodiment of two example additional vehicles, such as two solar module carrier-robots, connect to the autonomous ground vehicle via its own mechanical and electrical coupling mechanism, such as a first solar module carrier-robot 200 and a second solar module carrier-robot 209.

FIG. 2 illustrates a block diagram of an embodiment of an example autonomous ground vehicle configured to communicate and otherwise cooperate with one or more additional vehicles, such as additional autonomous ground vehicles that can have wireless communication with the first autonomous ground vehicle to perform the solar module installation.

Each solar module carrier-robot 200 has a deck with space for one or more pallets of solar modules on its deck. A solar module carrier-robot 200 can have, for example, a slanted deck section for placing stacks and pallets of solar module modules onto its deck.

Alternatively, (see FIG. 1) the autonomous ground vehicle 100 for solar module installation can have, for example, an extra long flat deck section for placing stacks and pallets of solar module modules onto its deck. The autonomous ground vehicle 100 may also have another section on its deck where it's a robotic arm 120 track and robotic arm 120 are located.

The deck of the autonomous ground vehicle 100 and/or its cooperating solar module carrier-robot 200 can have an area for placement of two or more pallets of solar modules/panels onto the deck, with sensors in that area to determine by any combination of i) by weight, by vision, and/or by count to determine when an amount of remaining solar modules/panels on the deck is getting low and/or is empty. The solar module carrier-robot 200 may have sensors to measure the weight of the pallets of solar modules on the deck of the solar module carrier-robot 200 to sense when the amount of solar modules on the deck is running low and should send out an automated signal to a material handler to come over to the vehicle with more pallets of solar modules to be transferred onto the deck.

The coupling mechanism can mechanically and electrically connect the solar module carrier-robot 200 and the autonomous ground vehicle 100 via e.g. a mechanical hitch and an electrical mating interface. The coupling mechanism can be installed on both a front and a rear of the autonomous ground vehicle 100 for solar module placement. During a coupling operation, the autonomous ground vehicle 100 communicates and cooperates with the solar module carrier-robot 200 through the connecting mechanical. While moving/driving and coupled, the solar module carrier-robot 200 can communicate and place the drive system of the solar module carrier-robot 200 into a follower mode making the drive system of the autonomous ground vehicle 100 the master. The solar module carrier-robot 200 can have its own GPS and a vision system to help find the autonomous ground vehicle 100 as well as aid in coupling the coupling mechanism between the two. The systems (e.g. computer vision system, GPS, etc.) of the solar module carrier-robot 200 can communicate and cooperate with the autonomous ground vehicle 100 and/or the robotic arm 120 to assist when a solar module is being installed. The coupling mechanism also has a de-coupler tool to allow the solar module carrier-robot 200 to decouple and go get more solar modules.

FIG. 1 illustrates a block diagram of an embodiment of an example robotic arm 120 mounted on an autonomous ground vehicle 100 for solar module installation. The robotic arm sits 120 atop of an off-road, self-leveling autonomous ground vehicle 100 that can adapt to any job site conditions.

Again, the robotic arm 120 is configured to work with the sensors and coded algorithms to pick up and place the solar modules from the deck/container of the solar module carrier-robot 200 into position to be connected into the solar tracker. This robotic arm 120 can travel up and down, e.g., a 6-axis or a 7-axis robotic arm 120 track to be able to pick up and place solar modules in place while the autonomous ground vehicle 100 remains in place. The autonomous ground vehicle 100 can self-level the platform relative to the tracker and the terrain via its mechanisms discussed herein. The robotic arm 120 can pick up the solar module from the deck/container of the solar module carrier-robot 200 coupled to either the front or the rear of the autonomous solar module installation platform for solar module installation. The robotic arm 120 can raise the solar module out and over to the solar tracker, and then place the solar module very near the panel mounting location on the solar tracker via using the GPS coordinates of the tracker, its computer vision system, and a Lidar-based system for placing the solar modules into the corresponding panel mounting location on the tracker. The robotic arm 120 lifts the solar modules/panels into installation position to hover over the tracker mounts. The robotic arm 120 can hold and suspend the weight of the solar module and then mechanically follow i) a human's pulling or pushing of the solar module or ii) similar controls from a remote control in order to then guide the solar module, while the robotic arm 120 holds the weight of the solar module, into the panel mounts on the solar tracker. In an embodiment, when the robotic arm 120 has the solar module approximate to the panel mounts to the solar tracker, then a person can use a remote control to lower and place the solar module into the mounts of the tracker or in some cases guide the panel with his or her hands into the mounts of the tracker.

A construction and shape of a body of robotic arm 120 is configured to have a range of motion of, at least, 360 degrees. A robotic installation cell is constructed with materials and powerful enough motor to have a robot arm capable of readily handling a solar module weighing 60-200 pounds (lbs.) in low to moderate windy conditions. In an embodiment, the robot arm is constructed to readily handle a solar module weighing 60-80 pounds. The robotic installation cell has a multi-axis track to move the robot arm in, for example, 7 axes independently of the platform moving. The robotic installation cell is configured to cooperate with the GPS and computer vision system to control and determine solar module placement. In an embodiment, the robotic arm can pick up the solar panel from a deck, raise the solar module out and over to the solar tracker, and then place the solar module in place onto the solar tractor via using both the GPS coordinates of the solar tracker and a visual LIDAR-based system for placing the solar panels into the corresponding location onto the solar tracker. The autonomous ground vehicle is configured to put multiple solar modules in place, installed, and secured per each time that the autonomous ground vehicle 100 moves itself and then self-levels in place. The robotic arm can travel forward and backward in the track to place the multiple solar panels in place while the vehicle does not have to move and has self-leveled itself.

In an embodiment, the robotic cell with the robotic arm is configured to ensure at least two pallets of solar modules, one in use and one in queue are approximate for continuous operations. The robotic cell uses weight sensors, and determines when a new pallet is needed and makes a call and sets off visual signal. The robotic cell has an industrial robotic arm on a robotic 7th axis track to index installation independently from the platform. This allows the robot to install several modules one after another before running out of track. Once the robot runs out of track to index, the entire platform will move forward and reset the index and recalibrate. The robot arm determines placement using GPS and a vision component. The robot then uses suction cups or other mechanism to pick, place, and hold. Simultaneously, the robotic cell communicates with the fastener robot and/or cooperating human and waits for an "all fastened" signal to be returned indicating the installation processes is complete for that solar module.

The autonomous ground vehicle 100 can have a wind sensor and an algorithm to compensate for the wind and the direction the wind is blowing when installing the solar panels. The autonomous ground vehicle may also have a moveable wind block wall that raises from the deck to block the wind when in windy conditions that would substantially affect the robotic arm picking up and placing the solar panel onto the tracker.

The robotic arm 120 may be completely guided by computer vision to use suction cups or other grasping mechanism to lift the solar module out of the container of the solar module carrier-robot 200 to be near the horizontal supports of the tracker. Note, a human can have remote control for manual override on the robotic arm 120 to affect the angle and movement of the robotic arm 120 to assist in the picking up and placement of the solar module on to the tracker.

The autonomous ground vehicle 100 can put one or more solar modules in place per each time that the vehicle itself moves and then self-levels in place. Note, the automatic ground vehicle may have a library of known solar trackers and how each one is configured to allow installation of solar modules onto that particular type of solar tracker. In addition, the library contains solar module dimensions and weight of individual solar modules on a per manufacturer and panel type basis.

The autonomous ground vehicle 100 will then select and follow the procedure for that particular type of solar tracker to install the solar module properly in place, guided by the computer vision and GPS, and then secure the solar module in place. The panel sizes can vary per manufacturer and the tracker's height and mountings can also differ per manufacturer. The autonomous ground vehicle 100 uses its vision system to locate and make decisions, for example, on placement of solar modules, allowing adaptation to any tracker or mounting system by referencing the library of known solar trackers and the installation steps for each solar tracker.

The deck of the autonomous ground vehicle 100 can have a robotic installation cell for pick up and placement of solar modules/panels. The robotic installation cell can have a multi-axis track to move the robot arm in multiple axes such as 7 axes independently of the autonomous ground vehicle 100 moving itself. The robotic installation cell can use GPS and a Vision system to control and determine solar module placement. The autonomous ground vehicle platform 100 can have a section on its deck where it's a robotic arm track and robotic arm are located. The robotic arm is configured to work with the sensors and coded algorithms to pick up and place the solar panels onto the solar tracker. This robotic arm can travel up and down the multiple-axis robotic arm track to be able to pick up and place solar panels in place while the autonomous ground vehicle remains in place.

Next, the autonomous ground vehicle 100 may have a battery along with the gas-powered engine or diesel powered engine. The power system is configured to have one or more three-phase AC motors and DC drive motors. The power system also has power surge protection.

Both the solar module carrier-robot 200 and the autonomous solar module installation platform for solar module installation can share a similar chassis. The chassis can have a diesel generator for a power supply. The diesel generator needs to supply enough power to move the roughly 5000 pound robot and in the case of the solar module carrier-robot 200 an example 8000 pound load of solar modules being carried by the solar module carrier-robot 200. The chassis has a housing to contain a computing system within the chassis that is water proof and dust proof via i) an access cover to the housing and ii) cooling lines into and out of the housing. The chassis contains the computing system and other electronics in a housing within the chassis that is water and dust proof with access through a cover. The chassis has a self-contained cooling system for the electronics with the chassis and is designed to keep portions of the chassis and other structures raising off the deck of the chassis to be low enough in height to allow the robotic arm 120 to have a range of motion of 360 degrees.

FIG. 1 illustrates a block diagram of an embodiment of an example autonomous solar module installation platform communicating with a fastening robot to fasten the solar module after the panel has been put in place onto the solar tracker. The autonomous solar module installation platform is configured to communicate and cooperate with a fastening robot 350. The fastening robot 350 has one or more arms and/or mechanisms to fasten a solar module to a solar tracker. The fastening robot 350 has various attachment tools to fasten. The fastening robot 350 is a robot on mobile platform. The fastening robot 350 has a GPS system and a vision system to determine fastener placement on the solar module to secure the solar module to the solar tracker. The fastening robot 350 is configured to communicate and cooperate with the autonomous solar module installation platform and/or the robotic installation cell.

In an embodiment, the autonomous ground vehicle 100 with the robotic arm 120 operates and coordinates with the fastening robot 350 that is configured to fasten the solar modules to the solar tracker. The fastening robot 350, which is configured to fasten the solar modules to the tracker, may fasten those solar modules by tightening up and installing bolts on threaded rods of the solar modules, by welding nuts in place, riveting, and/or other mechanisms for the solar modules to be secured to the solar tracker once properly placed into alignment on the solar tracker. The two robotic vehicles communicate with each other when 1) the automatic ground vehicle picks up and places the solar module into place onto the tracker then 2) a communication is sent to the fastening robot 350 to fasten the solar module that has been placed in place onto the horizontal supports of the tracker. The tracker has multiple horizontal supports and they have multiple bolt holes to accommodate different solar modules onto the tracker.

Alternatively, a human can fasten and secure the solar modules in place. Thus, the autonomous ground vehicle 100 may operate exactly as described; yet, a human may cooperate with the autonomous ground vehicle 100 to secure and fasten the solar module when properly positioned onto the tracker in place (vs a fastening robot 350). In addition, the human operator may have slightly greater control over the robotic arm 120 in the placement of the solar modules via the remote joystick.

The autonomous ground vehicle 100 can be physically large (20 ft×8 ft) to have deck space to accept two or more pallets of solar modules as well as room for a robot track for the robotic arm 120 to move along a portion of the deck.

In use, the autonomous ground vehicle 100 may be used to install solar modules onto a tracker in a new installation of solar modules in a solar farm. In addition, the autonomous ground vehicle 100 may be used to remove a damaged solar module and then install a new solar module in an existing solar farm. The removal operations in the software needs to reverse most of the steps in the installation steps. Accordingly, the autonomous ground vehicle 100 can use the GPS coordinates associated with a given tracker to go to that tracker and cooperate with the fastening robot 350 to unsecure a damaged solar module, pick up and remove the damaged solar module, pick up and install a new solar module onto the tracker, and then cooperate with the fastening robot 350 to secure the new panel in place on the tracker. The autonomous solar module installation platform can also be used to deconstruct the solar farms for retrofit of new panels.

Next, the autonomous ground vehicle 100 may also be equipped with a set of lights on various locations of the ground vehicle. The autonomous ground vehicle 100 has a set of lights to operate at night time as well as a low-light imaging sensor in a computer vision system to be able to operate in a low-light conditions and to continue the solar module installation onto solar trackers in a solar farm during both night and day. The computer vision may use night vision in order to pick up and place the solar modules in the proper positions and alignment at night. An advantage of the autonomous ground vehicle 100 is that the vehicle may install solar modules continuously throughout the day and night; thereby, cutting down the overall amount of time/number of days that is needed to install solar modules onto the rows upon rows of trackers in a solar farm. The robotics will reduce labor costs, have better productivity, and increase safety. The autonomous ground vehicle 100 having autonomy allows installation away from regular hours, provides a more flexible schedule, provides better visibility via real-time tracking tools, and aids in the future of labor shortages.

The system uses at least a vision system and one or more robots to install the solar modules. The autonomous ground vehicle 100 does not require any pre-fab or double handling of modules. The autonomous ground vehicle 100 has a computer vision system to install the solar module and assist in driving, has a computing system with programmed intelligence to make decisions on solar module installation and driving, and a communication module to wirelessly communicate with other apparatus, such as the solar module carrier-robot 200.

A fleet of robots can be coded to cooperate with each other and a central control room to install panels on a solar farm. A central robotic operation management system can manage and identify the location of all of the robots as well as coordinate their activities of bringing in more solar modules and installing the solar modules. The autonomous ground vehicle 100 and/or solar module carrier-robot 200 may have sensors to take the weight of the pallets of solar modules on the deck of the autonomous ground vehicle 100 and/or solar module carrier-robot 200 to sense when the amount of solar modules on the deck is running low and should send out an automated signal to a material handler for a second solar module carrier-robot 200 to come over to the autonomous ground vehicle 100 with more pallets of solar modules.

The robots (ground vehicle, panel carrier) will reduce human labor costs, have better productivity, and increase safety.

In an embodiment, the solar module installation system may perform the following steps.

The solar module installation system may use an autonomous solar module installation platform for the solar module installation onto a solar tracker, where the autonomous solar module installation platform includes at least an autonomous ground vehicle and a robotic arm for the solar module installation. The solar module installation system may use the autonomous ground vehicle to autonomously drive itself to the solar tracker and align itself with the solar tracker using a global positioning system and a vision system during the solar module installation onto the solar tracker.

The solar module installation system may use the vision system which includes one or more of i) a computer vision system, ii) a Lidar system, iii) and any combination of both, where the global positioning system a GPS sensor housed in the autonomous ground vehicle. The solar module installation system may use the vision system and the global positioning system to cooperate with driving software resident in a drive module for the autonomous ground vehicle to drive itself to the solar tracker and align itself with the solar tracker.

The solar module installation system may use a leveling mechanism consisting of any of i) screw actuators, ii) hydraulic cylinders, iii) airbags, iv) pneumatic actuators, and v) any combination of these, at multiple corners of a deck of the autonomous ground vehicle to level the robotic arm on the deck relative to the solar tracker, where the leveling mechanism cooperates with a level sensor in order to level relative to the solar tracker. The solar module installation system may use one or more of i) off-road deep-tread tires, ii) a tracked belt drive system, and iii) an engine to be able to maneuver the autonomous ground vehicle in tough terrain.

The solar module installation system may wirelessly communicate and otherwise cooperate the autonomous ground vehicle and one or more additional vehicles to perform the solar module installation, where a first additional vehicle has a deck with space for one or more pallets of solar modules on its deck so that the autonomous ground vehicle and the additional vehicles can perform the solar module installation on a continuous basis. The solar module installation system may construct the autonomous ground vehicle to be physically large enough to have deck space to accept one or more pallets of solar modules as well as the robotic arm. The solar module installation system may use a computer vision system in the autonomous ground vehicle to install the solar module, a computing system with programmed intelligence to make decisions to drive the autonomous ground vehicle, and a communication module in the autonomous ground vehicle to wirelessly communicate with other apparatus.

The autonomous ground vehicle may lift the solar module overhead and align with the mounting system on the solar tracker. The fastening robot may mechanically fasten the solar panel to mount with, e.g., nuts bolts, bracket, etc. The autonomous ground vehicle and the fastening robot repeat these functions for the next panel.

The autonomous ground vehicle may be fully autonomous. The autonomous ground vehicle may be self leveling, rough terrain automated ground vehicle (AGV). A work cell on the AGV can consists of two pallets of solar modules, a robotic arm, and a robotic track. A material handler can load pallets of solar modules onto the autonomous ground vehicle. The robot arm can pick up the solar module from the pallet and place it on the mounting system. A second robot can follow and fasten solar modules. The robotic arm can "index" on the track and perform a next pick up and place of a solar module. This process can repeat. When the "index" runs out, the autonomous ground vehicle will move forward and restart indexing. An operator observes and verifies installation. When a pallet of solar modules runs out, a signal is sent to a material handler to replenish a pallet of solar modules.

The autonomous ground vehicle may be partially autonomous. The autonomous ground vehicle and arm forming the AGV platform can collaboratively install solar modules with an operator. Thus, the robotic portions of the AGV platform and the operator installer work in tandem. The robotic arm picks up and places the solar module on the solar tracker. The operator fastens the solar module in place.

In an embodiment, the autonomous ground vehicle may be a remotely operated, powered platform. The autonomous ground vehicle may have a manually operated crane with an intelligent lift assist to install solar modules by picking them up and placing the solar module using the crane/lift. A second installer can follow and fasten the solar module.

In an embodiment, the autonomous ground vehicle may be a heavy duty automated ground vehicle (AGV). The autonomous ground vehicle may have spatial collaboration between two robots working to install the solar module. The autonomous ground vehicle may have differing power/battery requirements. The autonomous ground vehicle may have ruggedization of equipment used on the platform. The autonomous ground vehicle is engineered to deal with environmental factors such as dust and wind, ambient light levels, and different aspects of terrain. The solar tracker type may vary such as a tracker system vs. a fixed tilt, 1 in portrait vs. 2 in portrait, etc. The fastening implementation can include ways such as Nuts and bolts, rivets, clamps, and/or brackets.

Network

Figure 3:
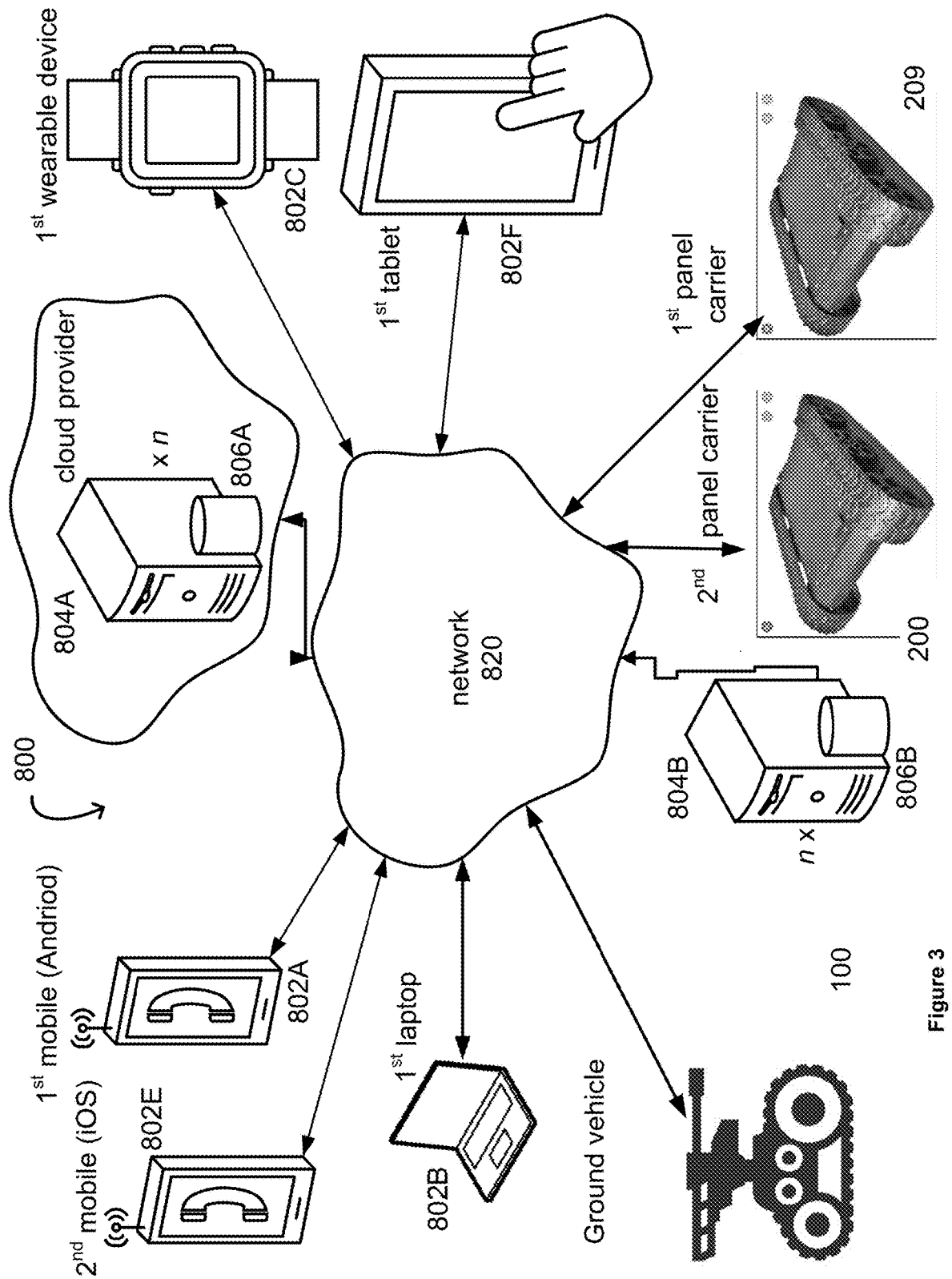
FIG. 3 illustrates a diagram of a number of electronic systems and devices communicating with each other in a network environment in accordance with an embodiment of the autonomous solar module installation platform for solar module installation onto a solar tracker.

FIG. 3 illustrates a diagram of a number of electronic systems and devices communicating with each other in a network environment in accordance with an embodiment of the autonomous solar module installation platform for solar module installation onto a solar tracker. The network environment 800 has a communications network 820. The network 820 can include one or more networks selected from an optical network, a cellular network, the Internet, a Local Area Network ("LAN"), a Wide Area Network ("WAN"), a satellite network, a fiber network, a cable network, and combinations thereof. In an embodiment, the communications network 820 is the Internet. As shown, there may be many server computing systems and many client computing systems connected to each other via the communications network 820. However, it should be appreciated that, for example, a single client computing system can also be connected to a single server computing system. Thus, any combination of server computing systems and client computing systems may connect to each other via the communications network 820. The autonomous ground vehicle 100 can work in this network environment in order to communicate with other parts of the system as well as receive communications, such as GPS.

The communications network 820 can connect one or more server computing systems selected from at least a first server computing system 804A, two or more solar module carrier-robots 200, 209, an autonomous vehicle 100, and one or more client computing systems 802A thru 802F to communicate with each other. The vehicles on the solar farm, e.g. solar module carrier-robots 200, 209, the autonomous vehicle 100, another the autonomous vehicle 100 but lengthened to carry solar modules, all can wirelessly talk to each other as well as they communicate with the control room in a solar farm using these networks. The server computing systems 804A and 804B can each optionally include organized data structures such as databases 806A and 806B. Each of the one or more server computing systems 804A and 804B can have one or more virtual server computing systems, and multiple virtual server computing systems can be implemented by design. The network 820 can have one or more firewalls to protect data integrity.

The client computing systems can be selected from a first mobile computing device 802A (e.g., smartphone with an Android-based operating system), a second mobile computing device 802E (e.g., smartphone with an iOS-based operating system), a first wearable electronic device 802C (e.g., a smartwatch), a first portable computer 802B (e.g., laptop computer), a third mobile computing device or second portable computer 802F (e.g., tablet with an Android- or iOS-based operating system), the autonomous ground vehicle 100, solar module carrier-robots 200, 209 and the like. Each of the client computing systems (e.g., 802A, 802C, 802D, 802E, 802F, 802G, 802H, and/or 804C) can include, for example, the software application or the hardware-based system in which the training of the artificial intelligence can occur and/or can be deployed into. Each of the one or more client computing systems can have one or more firewalls to protect data integrity.

It should be appreciated that the use of the terms "client computing system" and "server computing system" is intended to indicate the system that generally initiates a communication and the system that generally responds to the communication. For example, a client computing system can generally initiate a communication and a server computing system generally responds to the communication. No hierarchy is implied unless explicitly stated. Both functions can be in a single communicating system or device, in which case, the client-server and server-client relationship can be viewed as peer-to-peer. Thus, if the first portable computer 802B (e.g., the client computing system) and the server computing system 804A can both initiate and respond to communications, their communications can be viewed as peer-to-peer. Additionally, the server computing systems 804A and 804B include circuitry and software enabling communication with each other across the network 820. Server 804B may send, for example, simulator data to server 804A.

Any one or more of the server computing systems can be a cloud provider. A cloud provider can install and operate application software in a cloud (e.g., the network 820 such as the Internet) and cloud users can access the application software from one or more of the client computing systems. Generally, cloud users that have a cloud-based site in the cloud cannot solely manage a cloud infrastructure or platform where the application software runs. Thus, the server computing systems and organized data structures thereof can be shared resources, where each cloud user is given a certain amount of dedicated use of the shared resources. Each cloud user's cloud-based site can be given a virtual amount of dedicated space and bandwidth in the cloud. Cloud applications can be different from other applications in their scalability, which can be achieved by cloning tasks onto multiple virtual machines at run-time to meet changing work demand. Load balancers distribute the work over the set of virtual machines. This process is transparent to the cloud user, who sees only a single access point.

Cloud-based remote access can be coded to utilize a protocol, such as Hypertext Transfer Protocol ("HTTP"), to engage in a request and response cycle with an application on a client computing system such as a web-browser application resident on the client computing system. The cloud-based remote access can be accessed by a smartphone, a desktop computer, a tablet, or any other client computing systems, anytime and/or anywhere. The cloud-based remote access is coded to engage in 1) the request and response cycle from all web browser-based applications, 3) the request and response cycle from a dedicated on-line server, 4) the request and response cycle directly between a native application resident on a client device and the cloud-based remote access to another client computing system, and 5) combinations of these.

In an embodiment, the server computing system 804A can include a server engine, a web page management component or direct application component, a content management component, and a database management component. The server engine can perform basic processing and operating-system level tasks. The web page management component can handle creation and display or routing of web pages or screens associated with receiving and providing digital content and digital advertisements, through a browser. Likewise, the direct application component may work with a client app resident on a user's device. Users (e.g., cloud users) can access one or more of the server computing systems by means of a Uniform Resource Locator ("URL") associated therewith. The content management component can handle most of the functions in the embodiments described herein. The database management component can include storage and retrieval tasks with respect to the database, queries to the database, and storage of data.

In an embodiment, a server computing system can be configured to display information in a window, a web page, or the like. An application including any program modules, applications, services, processes, and other similar software executable when executed on, for example, the server computing system 804A, can cause the server computing system 804A to display windows and user interface screens in a portion of a display screen space.

Each application has a code scripted to perform the functions that the software component is coded to carry out such as presenting fields to take details of desired information. Algorithms, routines, and engines within, for example, the server computing system 804A can take the information from the presenting fields and put that information into an appropriate storage medium such as a database (e.g., database 806A). A comparison wizard can be scripted to refer to a database and make use of such data. The applications may be hosted on, for example, the server computing system 804A and served to the specific application or browser of, for example, the client computing system 802B. The applications then serve windows or pages that allow entry of details.

Computing Systems

Figure 4:
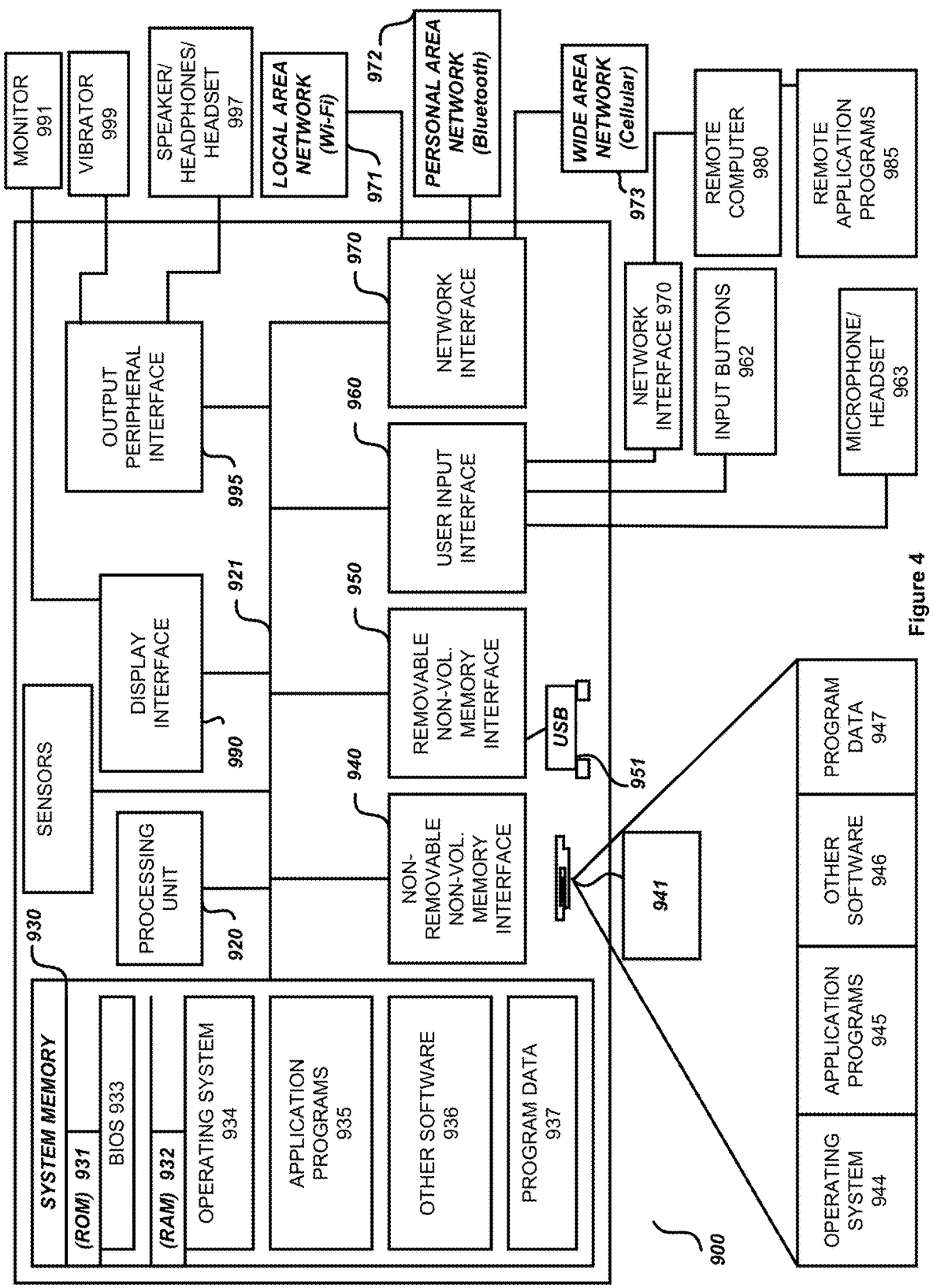
FIG. 4 illustrates a diagram of an embodiment of one or more computing devices that can be a part of the systems associated with the autonomous solar module installation platform for solar module installation onto a solar tracker.

FIG. 4 illustrates a diagram of an embodiment of one or more computing devices that can be a part of the systems associated with the autonomous solar module installation platform for solar module installation onto a solar tracker. The computing device 900 may include one or more processors or processing units 920 to execute instructions, one or more memories 930-932 to store information, one or more data input components 960-963 to receive data input from a user of the computing device 900, one or more modules that include the management module, a network interface communication circuit 970 to establish a communication link to communicate with other computing devices external to the computing device, one or more sensors where an output from the sensors is used for sensing a specific triggering condition and then correspondingly generating one or more preprogrammed actions, a display screen 991 to display at least some of the information stored in the one or more memories 930-932 and other components. Note, portions of this system that are implemented in software 944, 945, 946 may be stored in the one or more memories 930-932 and are executed by the one or more processors 920.

The system memory 930 includes computer storage media in the form of volatile and/or nonvolatile memory such as read-only memory (ROM) 931 and random access memory (RAM) 932. These computing machine-readable media can be any available media that can be accessed by computing system 900. By way of example, and not limitation, computing machine-readable media use includes storage of information, such as computer-readable instructions, data structures, other executable software, or other data. Computer-storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other tangible medium which can be used to store the desired information and which can be accessed by the computing device 900. Transitory media such as wireless channels are not included in the machine-readable media. Communication media typically embody computer readable instructions, data structures, other executable software, or other transport mechanism and includes any information delivery media.

The system further includes a basic input/output system 933 (BIOS) containing the basic routines that help to transfer information between elements within the computing system 900, such as during start-up, is typically stored in ROM 931. RAM 932 typically contains data and/or software that are immediately accessible to and/or presently being operated on by the processing unit 920. By way of example, and not limitation, the RAM 932 can include a portion of the operating system 934, application programs 935, other executable software 936, and program data 937.

The computing system 900 can also include other removable/non-removable volatile/nonvolatile computer storage media. By way of example only, the system has a solid-state memory 941. The solid-state memory 941 is typically connected to the system bus 921 through a non-removable memory interface such as interface 940, and USB drive 951 is typically connected to the system bus 921 by a removable memory interface, such as interface 950.

A user may enter commands and information into the computing system 900 through input devices such as a keyboard, touchscreen, or software or hardware input buttons 962, a microphone 963, a pointing device and/or scrolling input component, such as a mouse, trackball or touch pad. These and other input devices are often connected to the processing unit 920 through a user input interface 960 that is coupled to the system bus 921, but can be connected by other interface and bus structures, such as a parallel port, game port, or a universal serial bus (USB). A display monitor 991 or other type of display screen device is also connected to the system bus 921 via an interface, such as a display interface 990. In addition to the monitor 991, computing devices may also include other peripheral output devices such as speakers 997, a vibrator 999, and other output devices, which may be connected through an output peripheral interface 995.

The computing system 900 can operate in a networked environment using logical connections to one or more remote computers/client devices, such as a remote computing system 980. The remote computing system 980 can a personal computer, a mobile computing device, a server, a router, a network PC, a peer device or other common network node, and typically includes many or all of the elements described above relative to the computing system 900. The logical connections can include a personal area network (PAN) 972 (e.g., Bluetooth®), a local area network (LAN) 971 (e.g., Wi-Fi), and a wide area network (WAN) 973 (e.g., cellular network), but may also include other networks such as a personal area network (e.g., Bluetooth®). Such networking environments are commonplace in offices, enterprise-wide computer networks, intranets and the Internet. A browser application may be resonant on the computing device and stored in the memory.

When used in a LAN networking environment, the computing system 900 is connected to the LAN 971 through a network interface 970, which can be, for example, a Bluetooth® or Wi-Fi adapter. When used in a WAN networking environment (e.g., Internet), the computing system 900 typically includes some means for establishing communications over the WAN 973. With respect to mobile telecommunication technologies, for example, a radio interface, which can be internal or external, can be connected to the system bus 921 via the network interface 970, or other appropriate mechanism. In a networked environment, other software depicted relative to the computing system 900, or portions thereof, may be stored in the remote memory storage device. By way of example, and not limitation, the system has remote application programs 985 as residing on remote computing device 980. It will be appreciated that the network connections shown are examples and other means of establishing a communications link between the computing devices that may be used.

As discussed, the computing system 900 can include mobile devices with a processing unit 920, a memory (e.g., ROM 931, RAM 932, etc.), a built-in battery to power the computing device, an AC power input to charge the battery, a display screen, a built-in Wi-Fi circuitry to wirelessly communicate with a remote computing device connected to network.

It should be noted that the present design can be carried out on a computing system such as that described with respect to shown herein. However, the present design can be carried out on a server, a computing device devoted to message handling, or on a distributed system in which different portions of the present design are carried out on different parts of the distributed computing system.

In some embodiments, software used to facilitate algorithms discussed herein can be embedded onto a non-transitory machine-readable medium. A machine-readable medium includes any mechanism that stores information in a form readable by a machine (e.g., a computer). For example, a non-transitory machine-readable medium can include read-only memory (ROM); random access memory (RAM); magnetic disk storage media; optical storage media; flash memory devices; Digital Versatile Disc (DVD's), EPROMs, EEPROMs, FLASH memory, magnetic or optical cards, or any type of media suitable for storing electronic instructions.

Note, an application described herein includes but is not limited to software applications, mobile applications, and programs that are part of an operating system application. Some portions of this description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. These algorithms can be written in a number of different software programming languages such as C, C++, HTTP, Java, Python, or other similar languages. Also, an algorithm can be implemented with lines of code in software, configured logic gates in software, or a combination of both. In an embodiment, the logic consists of electronic circuits that follow the rules of Boolean Logic, software that contain patterns of instructions, or any combination of both. Any portions of an algorithm implemented in software can be stored in an executable format in portion of a memory and is executed by one or more processors. In an embodiment, a module can be implemented with electronics hardware such as electronic circuits including transistors, software blocks of functionality such as an application, routine, algorithm, etc., and combinations of the software cooperating with an electronic circuit.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

Many functions performed by electronic hardware components can be duplicated by software emulation. Thus, a software program written to accomplish those same functions can emulate the functionality of the hardware components in input-output circuitry. Thus, provided herein are one or more non-transitory machine-readable medium configured to store instructions and data that when executed by one or more processors on the computing device of the foregoing system, causes the computing device to perform the operations outlined as described herein.

References in the specification to "an embodiment," "an example", etc., indicate that the embodiment or example described may include a particular feature, structure, or characteristic, but every embodiment may not necessarily include the particular feature, structure, or characteristic. Such phrases can be not necessarily referring to the same embodiment. Further, when a particular feature, structure, or characteristic is described in connection with an embodiment, it is believed to be within the knowledge of one skilled in the art to affect such feature, structure, or characteristic in connection with other embodiments whether or not explicitly indicated.

While the foregoing design and embodiments thereof have been provided in considerable detail, it is not the intention of the applicant(s) for the design and embodiments provided herein to be limiting. Additional adaptations and/or modifications are possible, and, in broader aspects, these adaptations and/or modifications are also encompassed. Accordingly, departures may be made from the foregoing design and embodiments without departing from the scope afforded by the following claims, which scope is only limited by the claims when appropriately construed.

What is claimed is:

1. A system, comprising:
an autonomous solar module installation platform for solar module installation onto a solar tracker, where the autonomous solar module installation platform includes at least an autonomous ground vehicle with a robotic arm for the solar module installation;
a drive module;
a global positioning system (GPS), where the GPS includes a GPS sensor housed in the autonomous ground vehicle;
a vision system, where the vision system and the GPS are configured to cooperate with driving software resident and electronic hardware in the drive module in the autonomous ground vehicle to drive itself to the solar tracker and align itself with the solar tracker; and
wherein the autonomous ground vehicle has a wireless communication system configured to wirelessly communicate and otherwise cooperate with one or more additional vehicles to perform the solar module installation, and one or more sensors to determine a weight of one or more pallets of solar modules on a deck of the autonomous ground vehicle to sense when an amount of solar modules on the deck is running low and then communicate to send out an automated signal to a material handler to come over to the autonomous ground vehicle with more pallets of solar modules.

2. The system of claim 1, wherein the vision system includes one or more of i) a computer vision system, ii) a Lidar system, iii) and any combination of both.

3. The system of claim 2, wherein the drive module includes driving software that is configured to be stored on a non-transitory machine-readable medium that when executed by one or more processors is configured to cause one or more operations—of drive a route to GPS coordinates of the solar tracker when the solar tracker has a GPS device on that solar tracker.

4. The system of claim 1, wherein the autonomous ground vehicle is configured to have one or more of i) off-road deep-tread tires, ii) a tracked belt drive system, and iii) an engine to be able to maneuver in tough terrain.

5. The system of claim 1, wherein the autonomous ground vehicle is configured to wirelessly communicate with the one or more additional vehicles to perform the solar module installation using the wireless communication system, where a first additional vehicle has a deck with space for one or more pallets of solar modules on its deck.

6. The system of claim 1, wherein the autonomous ground vehicle is constructed to be physically large enough to have deck space to accept one or more pallets of solar modules as well as the robotic arm.

7. The system of claim 1, further comprising:
a set of lights; and
a computer vision system, wherein the autonomous ground vehicle has the set of lights to operate at night time—as well as the computer vision system—to be able to operate in low-light conditions and to continue the solar module installation onto solar trackers in a solar farm during both night and day.

8. The system of claim 1, wherein the vision system is a computer vision system, and wherein the autonomous ground vehicle has a computing system with programmed intelligence to make decisions.

9. The system of claim 1, wherein the autonomous ground vehicle is configured to have a tracked belt drive system.

10. A system, comprising:
an autonomous solar module installation platform for solar module installation onto a solar tracker,
where the autonomous solar module installation platform includes at least an autonomous ground vehicle with a robotic arm for the solar module installation,
a global positioning system (GPS),
a vision system, where the autonomous ground vehicle is configured to autonomously drive itself to the solar tracker and align itself with the solar tracker using the GPS and the vision system for the solar module installation onto the solar tracker; and
wherein the autonomous ground vehicle is further configured to self-level at least the robotic arm relative to the solar tracker, accounting for a terrain, using a leveling mechanism consisting of any of i) screw actuators, ii) hydraulic cylinders, iii) airbags, iv) pneumatic actuators, and v) any combination of these, at multiple corners of a deck of the autonomous ground vehicle, where the leveling mechanism is configured to cooperate with a level sensor in order to level the robotic arm relative to the solar tracker.

11. A method for solar module installation, comprising:
using an autonomous solar module installation platform for the solar module installation onto a solar tracker, where the autonomous solar module installation platform includes at least an autonomous ground vehicle with a robotic arm for the solar module installation;
using a vision system and a global positioning system (GPS) to cooperate with driving software resident in a drive module for the autonomous ground vehicle to drive itself to the solar tracker and align itself with the solar tracker; and
using a leveling mechanism consisting of any of i) screw actuators, ii) hydraulic cylinders, iii) airbags, iv) pneumatic actuators, and v) any combination of these, at multiple corners of a deck of the autonomous ground vehicle to level the robotic arm on the deck relative to the solar tracker, where the leveling mechanism cooperates with a level sensor in order to level relative to the solar tracker.

12. The method of claim 11, further comprising:
where the vision system includes one or more of i) a computer vision system, ii) a Lidar system, iii) and any combination of both, and where the GPS includes a GPS sensor housed in the autonomous ground vehicle.

13. The method of claim 12, wherein the driving software is coded to drive a route to GPS coordinates of the solar tracker when the solar tracker has a GPS device on that solar tracker.

14. The method of claim 11, further comprising:
using one or more of i) off-road deep-tread tires, ii) a tracked belt drive system, and iii) an engine to be able to maneuver the autonomous ground vehicle in tough terrain.

15. The method of claim 11, further comprising:
causing the autonomous ground vehicle to wirelessly communicate and otherwise cooperate with one or more additional vehicles to perform the solar module installation, where a first additional vehicle has a deck with space for one or more pallets of solar modules on its deck; and picking up a first solar module located on the deck of the first additional vehicle using the robotic arm of the autonomous ground vehicle.

16. The method of claim 11, further comprising:
activating a set of lights on the autonomous ground vehicle to operate at night time as well a computer vision system to be able to operate and to continue the solar module installation onto solar trackers in a solar farm during both night and day.

17. The method of claim 11, further comprising:
where the vision system is a computer vision system, and using 1) the computer vision system in the autonomous ground vehicle to install the solar module, 2) a computing system with programmed intelligence to make decisions to drive the autonomous ground vehicle, and 3) a communication module in the autonomous ground vehicle to wirelessly communicate with other apparatus.

18. The method of claim 11, wherein autonomously driving further comprises:
communicating between the vision system and the global positioning system, wherein the vision system includes a computer vision system, and a Lidar system, or any combination thereof; and
navigating the autonomous ground vehicle according to an output of the vision system and the global positioning system.

19. The method of claim 11, wherein the leveling step further comprises self-leveling including the steps of:
sensing a level of the robotic arm relative to the solar tracker using the level sensor;
wherein the leveling mechanism is a self-level actuator, actuating the self-level actuator located on each corner of the deck of the autonomous ground vehicle; and
positioning the robotic arm level relative to the solar tracker.

20. A system, comprising:
an autonomous solar module installation platform for solar module installation onto a solar tracker, where the autonomous solar module installation platform includes at least an autonomous ground vehicle with a robotic arm for the solar module installation;
a drive module;
a global positioning system (GPS), where the GPS includes a GPS sensor housed in the autonomous ground vehicle;
a vision system, where the vision system and the GPS are configured to cooperate with driving software resident and electronic hardware in the drive module in the autonomous ground vehicle to drive itself to the solar tracker and align itself with the solar tracker; and
wherein a level mechanism is configured to be mounted to a corner of a deck of the autonomous ground vehicle and is configured to be in communication with a level sensor to level the robotic arm relative to the solar tracker.

21. A method for solar module installation, comprising:
providing an autonomous solar module installation platform for solar module installation onto a solar tracker, where the autonomous solar module installation platform includes at least an autonomous ground vehicle with a robotic arm for the solar module installation;
providing a drive module;
providing a global positioning system (GPS), where the GPS includes a GPS sensor housed in the autonomous ground vehicle;

providing a vision system, where the vision system and the GPS are configured to cooperate with driving software resident and electronic hardware in the drive module in the autonomous ground vehicle to drive itself to the solar tracker and align itself with the solar tracker;

providing the autonomous ground vehicle with a wireless communication system to wirelessly communicate and otherwise cooperate with one or more additional vehicles to perform the solar module installation; and providing one or more sensors to determine a weight of one or more pallets of solar modules on a deck of the autonomous ground vehicle to sense when an amount of solar modules on the deck is running low and then communicate to send out an automated signal to a material handler to come over to the autonomous ground vehicle with more pallets of solar modules.

\* \* \* \* \*